United States Patent
Cao et al.

(10) Patent No.: US 12,047,047 B2
(45) Date of Patent: Jul. 23, 2024

(54) METHOD AND SYSTEM FOR INTELLIGENTLY ADJUSTING VOLUME, AND STORAGE MEDIUM

(71) Applicant: SHENZHEN TCL NEW TECHNOLOGY CO., LTD., Guangdong (CN)

(72) Inventors: Zhiyong Cao, Guangdong (CN); Xin Yao, Guangdong (CN); Chao Long, Guangdong (CN)

(73) Assignee: SHENZHEN TCL NEW TECHNOLOGY CO., LTD., Shenzhen (CN)

( * ) Notice: Subject to any disclaimer, the term of this patent is extended or adjusted under 35 U.S.C. 154(b) by 171 days.

(21) Appl. No.: 17/655,476

(22) Filed: Mar. 18, 2022

(65) Prior Publication Data

US 2022/0278664 A1    Sep. 1, 2022

Related U.S. Application Data

(63) Continuation of application No. PCT/CN2020/102900, filed on Jul. 20, 2020.

(30) Foreign Application Priority Data

Sep. 18, 2019 (CN) .......................... 201910882383.2

(51) Int. Cl.
*H03G 3/32*    (2006.01)
*H04N 5/60*    (2006.01)
(Continued)

(52) U.S. Cl.
CPC ................. *H03G 3/32* (2013.01); *H04N 5/60* (2013.01); *H04N 21/439* (2013.01); *H04N 21/44218* (2013.01)

(58) Field of Classification Search
CPC .............. H03G 3/32; H04N 21/42201; H04N 21/42203; H04N 21/439; H04N 21/44218;
(Continued)

(56) References Cited

U.S. PATENT DOCUMENTS

| 11,348,579 B1* | 5/2022 | Strand ............... H04M 3/42263 |
| 2014/0267933 A1* | 9/2014 | Young .............. H04N 21/42204 348/734 |

FOREIGN PATENT DOCUMENTS

| CN | 103702049 A | 4/2014 |
| CN | 105307077 A | 2/2016 |

(Continued)

OTHER PUBLICATIONS

Chinese Office Action issued in corresponding Chinese Patent Application No. 201910882383.2 dated Jul. 5, 2021, pp. 1-5.
(Continued)

*Primary Examiner* — Lun-See Lao
(74) *Attorney, Agent, or Firm* — PV IP PC; Wei Te Chung; Zhigang Ma (57) ABSTRACT

A voice module of a television collects environmental volume Vr of an environment where a user is located; first current volume Vc of the television is obtained and compared with the environmental volume Vr, so as to determine whether the television volume needs to be adjusted; a desired volume value of the television requiring volume adjustment is calculated by means of a volume curve dynamic adjustment algorithm, and the television automatically adjusts its volume to the desired volume value.

17 Claims, 2 Drawing Sheets

(51) Int. Cl.
 *H04N 21/439* (2011.01)
 *H04N 21/442* (2011.01)
(58) Field of Classification Search
 CPC .. H04N 5/60; H04R 2400/00; H04R 2430/01;
  H04R 2499/15; H04R 3/00
 USPC ................. 381/57–59, 104–107; 700/94
 See application file for complete search history.

(56) References Cited

FOREIGN PATENT DOCUMENTS

| | | | | |
|---|---|---|---|---|
| CN | 106453940 A | 2/2017 | | |
| CN | 107155133 A | 9/2017 | | |
| CN | 107908388 A | 4/2018 | | |
| CN | 108683944 A | 10/2018 | | |
| CN | 108810614 A | * 11/2018 | ........... | H04N 21/439 |
| CN | 108810614 A | 11/2018 | | |
| WO | 2014101486 A1 | 7/2014 | | |

OTHER PUBLICATIONS

International Search Report in International application No. PCT/CN2020/102900, mailed on Sep. 9, 2020.
Written Opinion of the International Search Authority in international application No. PCT/CN2020/102900, mailed on Sep. 9, 2020.
Chinese Office Action issued in corresponding Chinese Patent Application No. 201910882383.2 dated Jul. 5, 2021, pp. 1-7.

* cited by examiner

METHOD AND SYSTEM FOR INTELLIGENTLY ADJUSTING VOLUME, AND STORAGE MEDIUM

CROSS REFERENCE

This application is a continuation application of an International Application No. PCT/CN2020/102900, filed on Jul. 20, 2020, which claims the priority of Chinese Patent Application No. 201910882383.2, entitled "METHOD AND SYSTEM FOR INTELLIGENTLY ADJUSTING VOLUME, AND STORAGE MEDIUM", filed on Sep. 18, 2019, the disclosure of which is incorporated herein by reference in its entirety.

FIELD OF THE DISCLOSURE

The present disclosure relates to a digital data processing technology, and more particularly, to an intelligent volume adjustment method.

BACKGROUND INFORMATION

As the progress of the technology and the improvement of the human life, more and more digital terminal devices, such as smart TVs, radios, home stereos, home theaters, come in everyone's home. Conventionally, when a user uses a smart TV in different environments, the user often adjusts the volume manually to meet his demand.

Conventionally, an ambient volume sensor is added in the TV to detect the ambient volume. However, the sensor of the TV is affected by the speaker of itself. Furthermore, there might be a distance between the user and the TV, the user may move, the ambient volume may not be uniformly distributed, and the user's location may have a different volume. Therefore, the detected ambient volume may not 100% represent the actual volume at the place where the user is. In addition, another sensor may be installed in the remote control of the TV. However, this means that the user needs to carry the remote control with him and thus it's not convenient. Moreover, this mechanism requires an additional hardware cost and cannot be widely used in the actual implementation.

Therefore, the above conventional mechanism needs to improved.

SUMMARY

One objective of an embodiment of the present disclosure is to provide a smart volume adjusting method, which uses the conventional voice identification technique to collect the ambient volume where the TV is located to implement a smart volume control of the smart TV without increasing any hardware costs.

According to an embodiment of the present disclosure, a method of intelligently adjusting volume is disclosed. The method comprises: utilizing a television to collect an ambient volume $V_R$; utilizing the television to obtain a first current volume $V_C$ of a television and to compare the first current volume $V_C$ of the television with the ambient volume $V_R$ to determine whether a television volume needs to be adjusted; and upon a condition that the television volume needs to be adjusted, performing an intelligent volume adjustment on the television volume according to a sign of a difference between the first current volume $V_C$ of the television and the ambient volume $V_R$.

Optionally, in some embodiments, the step of utilizing the television to collect an ambient volume $V_R$ comprises: triggering a voice collecting module of the television to collect the ambient volume $V_R$.

Optionally, in some embodiments, the step of utilizing the television to obtain the first current volume $V_C$ of the television and to compare the first current volume $V_C$ of the television with the ambient volume $V_R$ to determine whether the television volume needs to be adjusted comprises: utilizing the television to obtain the first current volume VC of the television; calculating the difference between the first current volume VC of the television and the ambient volume VR according to a formula $\Delta V=V_R-V_C$; determining whether an absolute value of the difference $|\Delta V|$ is greater than a threshold value $\delta$; upon a condition that the absolute value of the difference $|\Delta V|$ is not greater than the threshold value $\delta$, determining that the television volume does not need to be adjusted; and upon a condition that the absolute value of the difference $|\Delta V|$ is greater than the threshold value $\delta$, determining that the television volume needs to be adjusted.

Optionally, in some embodiments, the step of performing the intelligent volume adjustment on the television volume according to the sign of the difference between the first current volume $V_C$ of the television and the ambient volume $V_R$ upon a condition that the television volume needs to be adjusted comprises: calculating the sign of the difference $\Delta V=V_R-V_C$ between the first current volume $V_C$ of the television and the ambient volume $V_R$; and upon a condition that the sign of the difference $\Delta V$ is positive, loading a second current volume $V_T$ of a television and calculating a television volume positive value $V_O$ according to a formula $$V_o = V_T + \frac{lg(1+\Delta V)}{lg(1+\Delta V_{max})} \times (V_{max} - V_T),$$

where $V_{max}$ is a maximum adjustable volume value of the television, and $\Delta V_{max}$ is a difference between the ambient volume $V_R$ and the maximum adjustable volume value $V_{max}$.

Optionally, in some embodiments, the step of performing the intelligent volume adjustment on the television volume according to the sign of the difference between the first current volume $V_C$ of the television and the ambient volume $V_R$ upon a condition that the television volume needs to be adjusted comprises: obtaining a positive adjustment curve according to a formula $$V_o = V_T + \frac{lg(1+\Delta V)}{lg(1+\Delta V_{max})} \times (V_{max} - V_T);$$

and adjusting the television volume positive value Vo according to the positive adjustment curve.

Optionally, in some embodiments, the step of performing the intelligent volume adjustment on the television volume according to the sign of the difference between the first current volume $V_C$ of the television and the ambient volume $V_R$ upon a condition that the television volume needs to be adjusted comprises: calculating the sign of the difference $\Delta V$ between the first current volume $V_C$ of the television and the ambient volume $V_R$; and upon a condition that the difference $\Delta V$ is a negative number, loading a second current volume $V_T$ of a television and calculating a television volume negative value Bo according to a formula $$B_o = \frac{\log_a(1+\Delta V)}{\log_a(1+\Delta V_{max})} \times V_T,$$

where a is equal to 0.1, $V_{max}$ is a maximum adjustable volume value of the television; and $\Delta V_{max}$ is a difference between the ambient volume $V_R$ and the maximum adjustable volume value $V_{max}$.

Optionally, in some embodiments, the step of performing the intelligent volume adjustment on the television volume according to the sign of the difference between the first current volume $V_C$ of the television and the ambient volume $V_R$ upon a condition that the television volume needs to be adjusted comprises: obtaining a negative adjustment curve according to a formula $$B_o = \frac{\log_a(1+\Delta V)}{\log_a(1+\Delta V_{max})} \times V_T;$$

and adjusting the television volume negative value Bo according to the positive adjustment curve.

According to another embodiment of the present disclosure, an intelligent volume adjustment system is disclosed. The system comprises a voice collecting module, a volume data analyzing module, and a volume adjusting module. The voice collecting module is configured to utilize a television to collect an ambient volume $V_R$. The volume data analyzing module is configured to utilize the television to obtain a first current volume $V_C$ of a television and to compare the first current volume $V_C$ of the television with the ambient volume $V_R$ to determine whether a television volume needs to be adjusted. The volume adjusting module is configured to perform an intelligent volume adjustment on the television volume according to a sign of a difference between the first current volume $V_C$ of the television and the ambient volume $V_R$ upon a condition that the television volume needs to be adjusted.

Optionally, in some embodiments, the voice collecting module is triggered by a user to collect the ambient volume $V_R$.

Optionally, in some embodiments, the volume data analyzing module utilizes the television to obtain a first current volume $V_C$ of a television and compares the first current volume $V_C$ of the television with the ambient volume $V_R$ to determine whether a television volume needs to be adjusted by performing at least following operations: utilizing the television to obtain the first current volume VC of the television; calculating the difference between the first current volume VC of the television and the ambient volume VR according to a formula $\Delta V=V_R-V_C$; determining whether an absolute value of the difference $|\Delta V|$ is greater than a threshold value δ; upon a condition that the absolute value of the difference $|\Delta V|$ is not greater than the threshold value δ, determining that the television volume does not need to be adjusted; and upon a condition that the absolute value of the difference $|\Delta V|$ is greater than the threshold value δ, determining that the television volume needs to be adjusted.

Optionally, in some embodiments, the volume adjusting module performs an intelligent volume adjustment on the television volume according to the sign of the difference between the first current volume $V_C$ of the television and the ambient volume $V_R$ upon a condition that the television volume needs to be adjusted by performing at least following operations: calculating the sign of the difference $\Delta V=V_R-V_C$ between the first current volume $V_C$ of the television and the ambient volume $V_R$; and upon a condition that the sign of the difference $\Delta V$ is positive, loading a second current volume $V_T$ of a television and calculating a television volume positive value $V_O$ according to a formula $$V_o = V_T + \frac{lg(1+\Delta V)}{lg(1+\Delta V_{max})} \times (V_{max} - V_T),$$

where $V_{max}$ is a maximum adjustable volume value of the television, and $\Delta V_{max}$ is a difference between the ambient volume $V_R$ and the maximum adjustable volume value $V_{max}$.

Optionally, in some embodiments, the volume adjusting module performs an intelligent volume adjustment on the television volume according to the sign of the difference between the first current volume $V_C$ of the television and the ambient volume $V_R$ upon a condition that the television volume needs to be adjusted by performing at least following operations: obtaining a positive adjustment curve according to a formula $$V_o = V_T + \frac{lg(1+\Delta V)}{lg(1+\Delta V_{max})} \times (V_{max} - V_T);$$

and adjusting the television volume positive value Vo according to the positive adjustment curve.

Optionally, in some embodiments, the volume adjusting module performs an intelligent volume adjustment on the television volume according to the sign of the difference between the first current volume $V_C$ of the television and the ambient volume $V_R$ upon a condition that the television volume needs to be adjusted by performing at least following operations: calculating the sign of the difference $\Delta V$ between the first current volume $V_C$ of the television and the ambient volume $V_R$; and upon a condition that the difference $\Delta V$ is a negative number, loading a second current volume $V_T$ of a television and calculating a television volume negative value Bo according to a formula $$B_o = \frac{\log_a(1+\Delta V)}{\log_a(1+\Delta V_{max})} \times V_T,$$

where a is equal to 0.1, $V_{max}$ is a maximum adjustable volume value of the television, and $\Delta V_{max}$ is a difference between the ambient volume $V_R$ and the maximum adjustable volume value $V_{max}$.

Optionally, in some embodiments, the volume adjusting module performs an intelligent volume adjustment on the television volume according to the sign of the difference between the first current volume $V_C$ of the television and the ambient volume $V_R$ upon a condition that the television volume needs to be adjusted by performing at least following operations: obtaining a negative adjustment curve according to a formula $$B_o = \frac{\log_a(1+\Delta V)}{\log_a(1+\Delta V_{max})} \times V_T;$$

and adjusting the television volume negative value Bo according to the positive adjustment curve.

According to an embodiment of the present disclosure, a storage medium is disclosed. The storage medium stores a smart volume adjusting program, which is executed by a processor to perform the above-mentioned smart volume adjusting method.

In contrast to the conventional art, the present disclosure utilizes the voice collecting module already embedded in the smart TV to collect the ambient volume of the user. This could raise the collection accuracy of the ambient volume. By comparing the collected ambient volume with the first current volume of the smart TV, the required volume is calculated according to a volume dynamic adjustment algorithm and the volume could be automatically adjusted to greater or lower. This could more satisfy the user's demand for accurately adjusting the volume without increasing additional hardware costs. Thus, this improves the user experiences.

BRIEF DESCRIPTION OF THE DRAWINGS

These and other features of the present disclosure will become apparent from the following description of some embodiments, given as a non-restrictive example with reference to the attached drawings.

DETAILED DESCRIPTION

The disclosure is described below in detail with reference to the accompanying drawings, wherein like reference numerals are used to identify like elements illustrated in one or more of the figures thereof, and in which exemplary embodiments of the disclosure are shown. This disclosure may, however, be embodied in many different forms and should not be construed as limited to the particular embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity.

As previously mentioned, the conventional smart TV requires additional hardware to obtain the ambient volume but still cannot accurately obtain the ambient volume of the user's location or accurately adjust the volume according to the user's environment. The present disclosure discloses an intelligent volume adjustment method to adjust the volume according to the user's environment without increasing any hardware costs and thus improves the user experiences.

Embodiment 1

Figure 1:
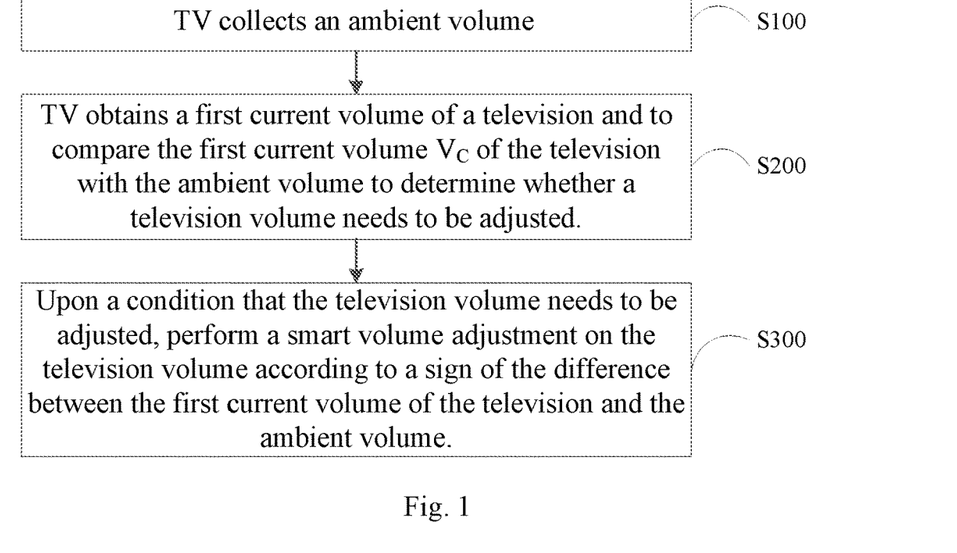
FIG. 1 is a flow chart of an intelligent volume adjustment method according to a preferred embodiment of the present disclosure.

Please refer to FIG. 1. FIG. 1 is a flow chart of an intelligent volume adjustment method according to a preferred embodiment of the present disclosure. The method comprises following steps:

Step S100: The TV collects an ambient volume $V_R$.

In order to adjust the volume according to the environment, the ambient volume at the place where the TV is located should be obtained first. For TV, the volume adjustment should be performed for its user. Surely, the ambient environment is the main factor of volume adjustment. The above-mentioned ambient volume should include not only the ambient volume of the TV itself but also the ambient volume of the user. In this way, the volume of the TV could be adjusted according to the ambient volume of the user such that the user could have better user experience. Specifically, in this embodiment, when the user is watching TV, the embedded voice collecting module of the TV could be triggered by the user to collect the ambient volume $V_R$ and transfer the ambient volume $V_R$ to the processing unit of the TV for storage.

Preferably, the voice collecting module could further collect the ambient volume of the place where the user is located and send it to the processing unit of the TV for storage. This could reflect the ambient volume $V_R$ of the TV more accurately.

Step S200: The TV obtains a first current volume $V_C$ of a television and to compare the first current volume $V_C$ of the television with the ambient volume $V_R$ to determine whether a television volume needs to be adjusted.

In this embodiment, when the TV obtains the ambient volume $V_R$, the first current volume $V_C$ of the TV needs to be obtained to compare the first current volume $V_C$ of the television with the ambient volume $V_R$ to calculate the difference $\Delta V$ between the ambient volume and the first current volume $V_C$ of the television according to a formula $\Delta V = V_R - V_C$.

Then, the TV determines whether the absolute value of the difference $|\Delta V|$ is greater than a predetermined threshold value $\delta$. If the absolute value of the difference $|\Delta V|$ is not greater than the threshold value $\delta$, then the user and the TV are almost in the same volume environment. This means that the user cannot tell the difference and thus the TV volume does not need to be adjusted.

If the absolute value of the difference $|\Delta V|$ is greater than the threshold value $\delta$, then the TV determines that the volume of the TV needs to be adjusted.

The threshold value $\delta$ can be preset according to the environment of the TV. For different environments of the TV, the threshold value $\delta$ can be set as a different value. For example, if the TV is put in a public place, then the threshold value $\delta$ needs to be a greater value. If the TV is placed in a quieter indoor place, then the threshold value $\delta$ needs to be a comparatively smaller value. In this way, the absolute value of the difference $|\Delta V|$ could reflect the change of the environment.

Step S300: Upon a condition that the television volume needs to be adjusted, perform an intelligent volume adjustment on the television volume according to a sign of the difference between the first current volume $V_C$ of the television and the ambient volume $V_R$.

The sign of the difference $\Delta V$ represents the direction for the volume adjustment (whether the volume needs to be positively or negatively adjusted). That is, the sign indicates whether the TV volumes needs to be adjusted to be greater or lower. After the adjustment direction is determined, the TV volume could be smartly adjusted according to the ambient volume $V_R$. Specifically, in this embodiment, the TV first determines the sign of the difference $\Delta V$ and the intelligent volume adjustment comprises following steps:

Calculate the sign of the difference $\Delta V = V_R - V_C$ between the first current volume $V_C$ of the television and the ambient volume $V_R$.

Upon a condition that the sign of the difference ΔV is positive, it represents that $V_R$ is greater than $V_C$ and the ambient volume of the user is greater. Therefore, the positive adjustment needs to be performed to raise the TV volume greater. The method for raising the TV volume comprises:

Load a second current volume $V_T$ of a television. Here, the second current volume $V_T$ of the television is a current TV volume loaded at the time when the TV determines that the TV volume needs to be adjusted. That is, when the TV determines that the TV volume needs to be adjusted, the TV sets the current TV volume as the second current volume $V_T$ of the television.

Calculate a television volume positive value $V_O$ according to a formula (1)

$$V_O = V_T + \frac{lg(1+\Delta V)}{lg(1+\Delta V_{max})} \times (V_{max} - V_T),$$

where $V_{max}$ is a maximum adjustable volume value of the television, and $\Delta V_{max}$ is a difference between the ambient volume $V_R$ and the maximum adjustable volume value $V_{max}$.

Figure 3:
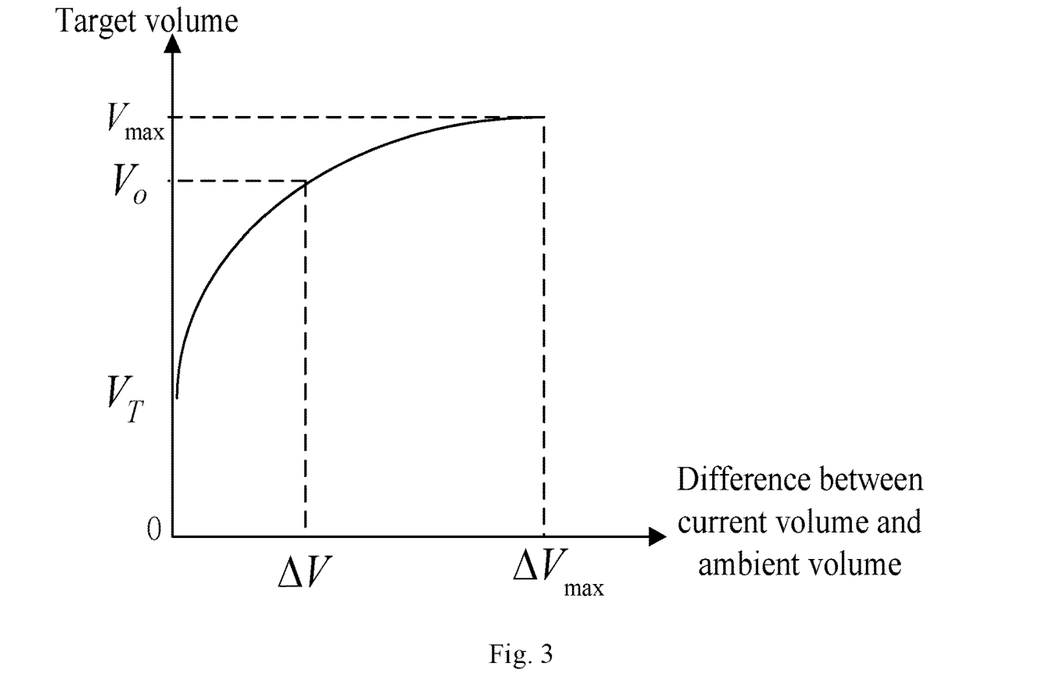
FIG. 3 is a positive adjustment curve of intelligent volume adjustment method according to a preferred embodiment of the present disclosure.

Please refer to FIG. 3. FIG. 3 is a positive adjustment curve of intelligent volume adjustment method according to a preferred embodiment of the present disclosure. The positive adjustment curve corresponds to the above-mentioned formula (1).

Then, the TV performs a positive adjustment on the TV volume according to the calculated TV volume positive value $V_O$. That is, the TV volume is automatically raised to the TV volume positive value $V_O$. The positive adjustment curve shown in FIG. 3 is a curve calculated according to the formula (1). According to different differences ΔV, different target volumes could be obtained. In this way, the television volume positive value $V_O$ could be adjusted according to the positive adjustment curve shown in FIG. 3 such that the volume adjustment could be more smooth and natural.

Upon a condition that the sign of the difference ΔV is negative, it represents that $V_R$ is lower than $V_C$ and the ambient volume of the user is lower. Therefore, the negative adjustment needs to be performed to lower the TV volume. The method for lowering the TV volume comprises:

Load a second current volume $V_T$ of a television. Here, the second current volume $V_T$ of the television is a current TV volume loaded at the time when the TV determines that the TV volume needs to be adjusted. That is, when the TV determines that the TV volume needs to be adjusted, the TV sets the current TV volume as the second current volume $V_T$ of the television.

Calculate a television volume negative value $B_O$ according to a formula (2)

$$B_O = \frac{\log_a(1+\Delta V)}{\log_a(1+\Delta V_{max})} \times V_T,$$

where a=0.1, $V_{max}$ is a maximum adjustable volume value of the television, and $\Delta V_{max}$ is a difference between the ambient volume $V_R$ and the maximum adjustable volume value $V_{max}$.

Figure 4:
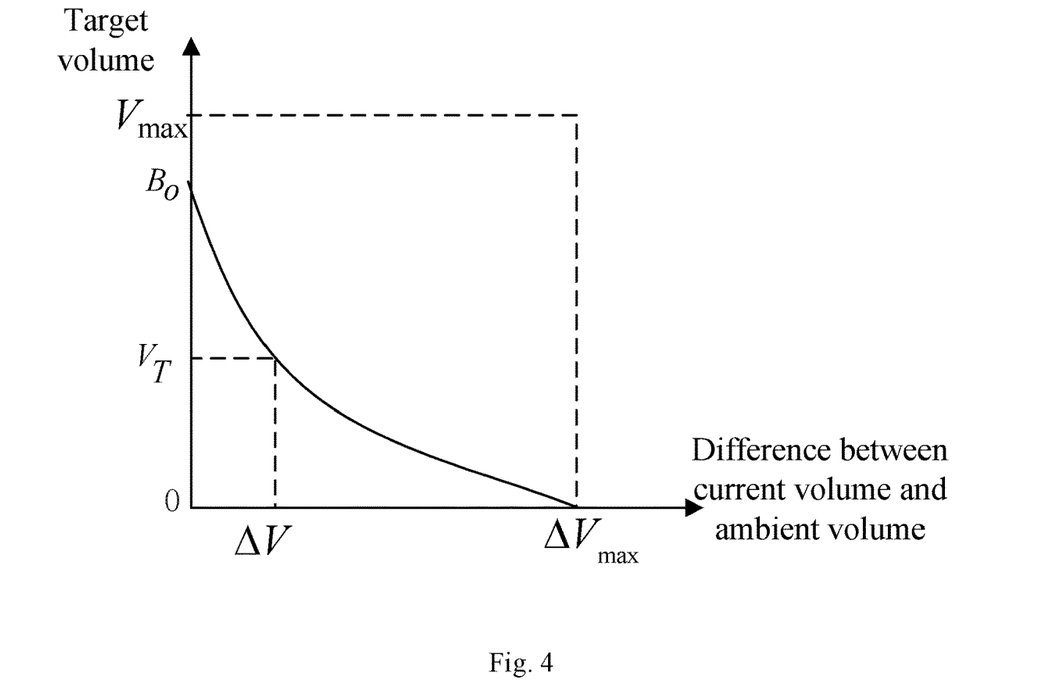
FIG. 4 is a negative adjustment curve of intelligent volume adjustment method according to a preferred embodiment of the present disclosure.

Please refer to FIG. 4. FIG. 4 is a negative adjustment curve of intelligent volume adjustment method according to a preferred embodiment of the present disclosure. The negative adjustment curve corresponds to the above-mentioned formula (2).

Then, the TV performs a negative adjustment on the TV volume according to the calculated TV volume negative value $B_O$. That is, the TV volume is automatically lowered to the TV volume positive value $B_O$. The negative adjustment curve shown in FIG. 4 is a curve calculated according to the formula (2). According to different differences ΔV, different target volumes could be obtained. In this way, the television volume positive value $B_O$ could be adjusted according to the negative adjustment curve shown in FIG. 4 such that the volume adjustment could be more smooth and natural.

According to an embodiment of the present disclosure, the intelligent volume adjustment method could correspondingly adjust the TV volume according to the environment of the TV and the ambient volume of the user's environment. In this way, the output TV volume could be smoothly adjusted and the user experience could be raised.

Embodiment 2

Figure 2:
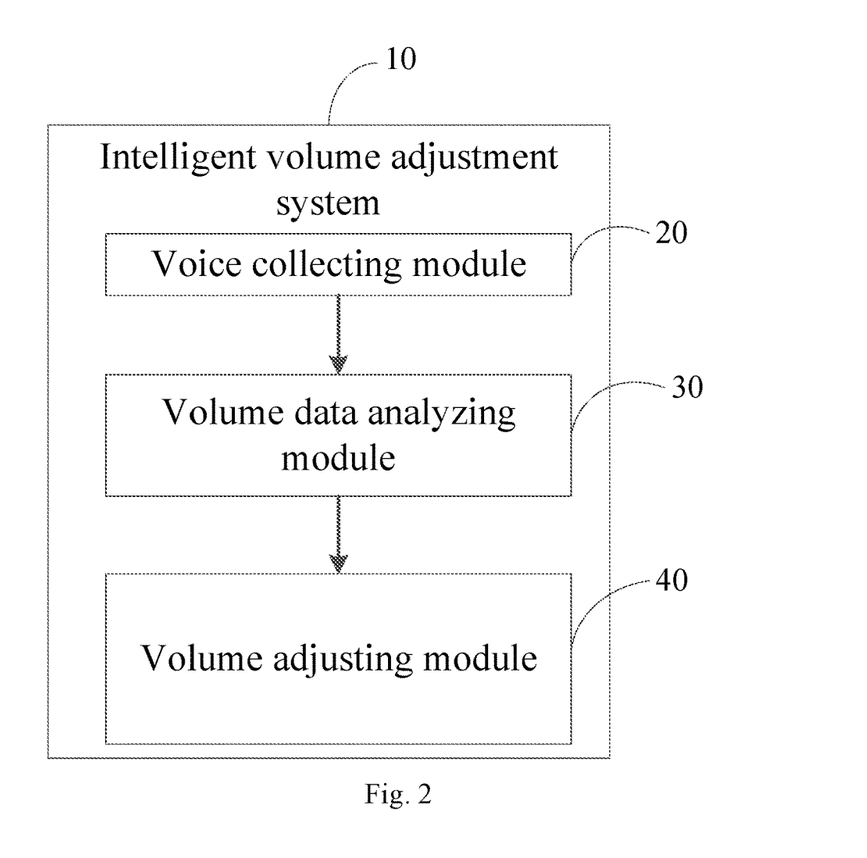
FIG. 2 is a diagram of an intelligent volume adjustment system according to a preferred embodiment of the present disclosure.

Please refer to FIG. 2. FIG. 2 is a diagram of an intelligent volume adjustment system 10 according to a preferred embodiment of the present disclosure. The intelligent volume adjustment system 10 comprises a voice collecting module 20, a volume data analyzing module 30, and a volume adjusting module 40.

The voice collecting module 20 is configured to utilize a television to collect an ambient volume $V_R$.

In order to adjust the volume according to the environment, the ambient volume at the place where the TV is located should be obtained first. For TV, the volume adjustment should be performed for its user. Surely, the ambient environment is the main factor of volume adjustment. The above-mentioned ambient volume should include not only the ambient volume of the TV itself but also the ambient volume of the user. In this way, the volume of the TV could be adjusted according to the ambient volume of the user such that the user could have better user experience. In this embodiment, the voice collecting module 20 is a voice module already embedded in the TV. The embedded voice collecting module 20 of the TV could be triggered by the user to collect the ambient volume $V_R$ and transfer the ambient volume $V_R$ to the voice data analyzing module 20.

Furthermore, the voice collecting module 20 could further collect the ambient volume of the place where the user is located and send it to the processing unit of the TV for storage. This could reflect the ambient volume $V_R$ of the TV more accurately.

The volume data analyzing module 30 is configured to utilize the television to obtain a first current volume $V_C$ of a television and to compare the first current volume $V_C$ of the television with the ambient volume $V_R$ to determine whether a television volume needs to be adjusted.

In this embodiment, the volume data analyzing module 30 obtains the first current volume $V_C$ of the television and compares the first current volume $V_C$ of the television with the ambient volume $V_R$ to calculate the difference ΔV between the ambient volume and the first current volume $V_C$ of the television according to a formula $\Delta V = V_R - V_C$.

Then, the volume data analyzing module 30 determines whether the absolute value of the difference |ΔV| is greater than a predetermined threshold value δ. If the absolute value of the difference |ΔV| is not greater than the threshold value δ, then the user and the TV are almost in the same volume environment. This means that the user cannot tell the difference and thus the TV volume does not need to be adjusted.

If the absolute value of the difference |ΔV| is greater than the threshold value δ, then the volume data analyzing module 30 determines that the volume of the TV needs to be adjusted.

The threshold value δ can be preset according to the environment of the TV. For different environments of the TV, the threshold value δ can be set as a different value. For example, if the TV is put in a public place, then the threshold value δ needs to be a greater value. If the TV is placed in a quieter indoor place, then the threshold value δ needs to be a comparatively smaller value. In this way, the absolute value of the difference ΔV| could reflect the change of the environment.

The volume adjusting module 40 is configured to perform an intelligent volume adjustment on the television volume according to a sign of the difference between the first current volume $V_C$ of the television and the ambient volume $V_R$ upon a condition that the television volume needs to be adjusted.

The sign of the difference ΔV represents the direction for the volume adjustment (whether the volume needs to be positively or negatively adjusted). That is, the sign indicates whether the TV volumes needs to be adjusted to be greater or lower. After the adjustment direction is determined, the TV volume could be smartly adjusted according to the ambient volume $V_R$. In this embodiment, if the absolute value of the difference |ΔV| is greater than the threshold value δ, then the volume of the TV needs to be adjusted and the sign of the difference ΔV is determined.

The intelligent volume adjustment comprises following steps: upon a condition that the sign of the difference ΔV is positive, it represents that $V_R$ is greater than $V_C$ and the ambient volume of the user is greater. Therefore, the positive adjustment needs to be performed to raise the TV volume greater.

Then, a second current volume $V_T$ of a television is loaded and a television volume positive value $V_O$ is calculated according to a formula (1)

$$V_O = V_T + \frac{lg(1+\Delta V)}{lg(1+\Delta V_{max})} \times (V_{max} - V_T);$$

wherein $V_{max}$ is a maximum adjustable volume value of the television; and $\Delta V_{max}$ is a difference between the ambient volume $V_R$ and the maximum adjustable volume value $V_{max}$.

Then, the volume adjusting module 40 performs a positive adjustment on the TV volume according to the calculated TV volume positive value $V_O$. That is, the TV volume is automatically raised to the TV volume positive value $V_O$. The above-mentioned positive adjustment method could be referred to the positive adjustment curve shown in FIG. 3. As previously mentioned, the TV performs a positive adjustment on the TV volume according to the calculated TV volume positive value $V_O$. That is, the TV volume is automatically raised to the TV volume positive value $V_O$. The positive adjustment curve shown in FIG. 3 is a curve calculated according to the formula (1). According to different differences ΔV, different target volumes could be obtained. In this way, the television volume positive value $V_O$ could be adjusted according to the positive adjustment curve shown in FIG. 3 such that the volume adjustment could be more smooth and natural.

Upon a condition that the sign of the difference ΔV is negative, it represents that $V_R$ is lower than $V_C$ and the ambient volume of the user is lower. Therefore, the negative adjustment needs to be performed to lower the TV volume.

In this case, a second current volume $V_T$ of a television is loaded and a television volume negative value $B_O$ is calculated according to a formula (2)

$$B_O = \frac{\log_a(1+\Delta V)}{\log_a(1+\Delta V_{max})} \times V_T;$$

wherein a=0.1, $V_{max}$ is a maximum adjustable volume value of the television; and $\Delta V_{max}$ is a difference between the ambient volume $V_R$ and the maximum adjustable volume value $V_{max}$.

Then, the volume adjusting module 40 performs a negative adjustment on the TV volume according to the calculated TV volume negative value $B_O$. That is, the TV volume is automatically lowered to the TV volume negative value $V_O$. The above-mentioned negative adjustment method could be referred to the positive adjustment curve shown in FIG. 4. As previously mentioned, the TV performs a negative adjustment on the TV volume according to the calculated TV volume negative value $B_O$. That is, the TV volume is automatically lowered to the TV volume negative value $B_O$. The positive adjustment curve shown in FIG. 4 is a curve calculated according to the formula (2). According to different differences ΔV, different target volumes could be obtained. In this way, the television volume negative value $B_O$ could be adjusted according to the negative adjustment curve shown in FIG. 4 such that the volume adjustment could be more smooth and natural.

The other working mechanisms of the volume curve adjustment algorithm could be referred to the above embodiments and further illustrations are omitted here for simplicity.

Embodiment 3

According to an embodiment of the present disclosure, a storage medium is disclosed. The storage medium is a non-transitory computer readable storage medium such as read only memory (ROM), a programmable ROM (PROM), electrically programmable ROM (EPROM), electrically erasable programmable ROM (EEPROM), or flash memory. The storage medium stores instructions executable by a processor to perform the steps of the above-mentioned smart volume adjusting method. The details for the functions and the mechanisms could be referred to the above method and system embodiments and further illustrations are omitted here for simplicity.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:
1. An intelligent volume adjustment method, the method comprising:
utilizing a television to collect an ambient volume $V_R$;
utilizing the television to obtain a first current volume $V_C$ of the television;
calculating a difference between the first current volume $V_C$ of the television and the ambient volume $V_R$ according to a formula $\Delta V = V_R - V_C$;

determining whether an absolute value of the difference |ΔV| is greater than a threshold value δ;

upon a condition that the absolute value of the difference |ΔV| is greater than the threshold value δ, determining that the television volume needs to be adjusted; and upon a condition that the television volume needs to be adjusted, performing an intelligent volume adjustment on the television volume according to a sign of a difference between the first current volume $V_C$ of the television and the ambient volume $V_R$.

2. The method of claim 1, wherein the step of utilizing the television to collect an ambient volume $V_R$ comprises:
triggering a voice collecting module of the television to collect the ambient volume $V_R$.

3. The method of claim 1, wherein the step of performing the intelligent volume adjustment on the television volume according to the sign of the difference between the first current volume $V_C$ of the television and the ambient volume $V_R$ upon a condition that the television volume needs to be adjusted comprises:
calculating the sign of the difference $\Delta V = V_R - V_C$ between the first current volume $V_C$ of the television and the ambient volume $V_R$; and
upon a condition that the sign of the difference ΔV is positive, loading a second current volume $V_T$ of the television and calculating a television volume positive value $V_O$ according to a formula $$V_O = V_T + \frac{lg(1+\Delta V)}{lg(1+\Delta V_{max})} \times (V_{max} - V_T),$$

where $V_{max}$ is a maximum adjustable volume value of the television, and $\Delta V_{max}$ is a difference between the ambient volume $V_R$ and the maximum adjustable volume value $V_{max}$.

4. The method of claim 3, wherein the step of performing the intelligent volume adjustment on the television volume according to the sign of the difference between the first current volume $V_C$ of the television and the ambient volume $V_R$ upon a condition that the television volume needs to be adjusted comprises:
obtaining a positive adjustment curve according to a formula $$V_O = V_T + \frac{lg(1+\Delta V)}{lg(1+\Delta V_{max})} \times (V_{max} - V_T);$$

and
adjusting the television volume positive value Vo according to the positive adjustment curve.

5. The method of claim 1, wherein the step of performing the intelligent volume adjustment on the television volume according to the sign of the difference between the first current volume $V_C$ of the television and the ambient volume $V_R$ upon a condition that the television volume needs to be adjusted comprises:
calculating the sign of the difference ΔV between the first current volume $V_C$ of the television and the ambient volume $V_R$; and
upon a condition that the difference ΔV is a negative number, loading a second current volume $V_T$ of a television and calculating a television volume negative value $B_O$ according to a formula $$B_O = \frac{\log_a(1+\Delta V)}{\log_a(1+\Delta V_{max})} \times V_T,$$

where a is equal to 0.1, $V_{max}$ is a maximum adjustable volume value of the television, and $\Delta V_{max}$ is a difference between the ambient volume $V_R$ and the maximum adjustable volume value $V_{max}$.

6. The method of claim 5, wherein the step of performing the intelligent volume adjustment on the television volume according to the sign of the difference between the first current volume $V_C$ of the television and the ambient volume $V_R$ upon a condition that the television volume needs to be adjusted comprises:
obtaining a negative adjustment curve according to a formula $$B_O = \frac{\log_a(1+\Delta V)}{\log_a(1+\Delta V_{max})} \times V_T;$$

and
adjusting the television volume negative value $B_O$ according to the positive adjustment curve.

7. An intelligent volume adjustment system, comprising:
a voice collecting module, configured to collect an ambient volume $V_R$ of a television;
a volume data analyzing module, configured to obtain a first current volume $V_C$ of the television, to calculate a difference between the first current volume $V_C$ of the television and the ambient volume $V_R$ according to a formula $\Delta V = V_R - V_C$, to determine whether an absolute value of the difference |ΔV| is greater than a threshold value δ, and to determine that the television volume needs to be adjusted upon a condition that the absolute value of the difference |ΔV| is greater than the threshold value δ; and
a volume adjusting module, configured to perform an intelligent volume adjustment on the television volume according to a sign of a difference between the first current volume $V_C$ of the television and the ambient volume $V_R$ upon a condition that the television volume needs to be adjusted.

8. The system of claim 7, wherein the voice collecting module is triggered by a user to collect the ambient volume $V_R$.

9. The system of claim 7, wherein the volume adjusting module performs an intelligent volume adjustment on the television volume according to the sign of the difference between the first current volume $V_C$ of the television and the ambient volume $V_R$ upon a condition that the television volume needs to be adjusted by performing at least following operations:
calculating the sign of the difference $\Delta V = V_R - V_C$ between the first current volume $V_C$ of the television and the ambient volume $V_R$; and
upon a condition that the sign of the difference ΔV is positive, loading a second current volume $V_T$ of a television and calculating a television volume positive value $V_O$ according to a formula $$V_O = V_T + \frac{lg(1+\Delta V)}{lg(1+\Delta V_{max})} \times (V_{max} - V_T),$$

where $V_{max}$ is a maximum adjustable volume value of the television, and $\Delta V_{max}$ is a difference between the ambient volume $V_R$ and the maximum adjustable volume value $V_{max}$.

10. The system of claim 9, wherein the volume adjusting module performs an intelligent volume adjustment on the television volume according to the sign of the difference between the first current volume $V_C$ of the television and the ambient volume $V_R$ upon a condition that the television volume needs to be adjusted by performing at least following operations:

obtaining a positive adjustment curve according to a formula $$V_O = V_T + \frac{lg(1+\Delta V)}{lg(1+\Delta V_{max})} \times (V_{max} - V_T);$$

and
adjusting the television volume positive value Vo according to the positive adjustment curve.

11. The system of claim 7, wherein the volume adjusting module performs an intelligent volume adjustment on the television volume according to the sign of the difference between the first current volume $V_C$ of the television and the ambient volume $V_R$ upon a condition that the television volume needs to be adjusted by performing at least following operations:

calculating the sign of the difference $\Delta V$ between the first current volume $V_C$ of the television and the ambient volume $V_R$; and upon a condition that the difference $\Delta V$ is a negative number, loading a second current volume $V_T$ of a television and calculating a television volume negative value $B_O$ according to a formula $$B_O = \frac{\log_a(1+\Delta V)}{\log_a(1+\Delta V_{max})} \times V_T,$$

where a is equal to 0.1, $V_{max}$ is a maximum adjustable volume value of the television, and $\Delta V_{max}$ is a difference between the ambient volume $V_R$ and the maximum adjustable volume value $V_{max}$.

12. The system of claim 11, wherein the volume adjusting module performs an intelligent volume adjustment on the television volume according to the sign of the difference between the first current volume $V_C$ of the television and the ambient volume $V_R$ upon a condition that the television volume needs to be adjusted by performing at least following operations:

obtaining a negative adjustment curve according to a formula $$B_O = \frac{\log_a(1+\Delta V)}{\log_a(1+\Delta V_{max})} \times V_T;$$

and
adjusting the television volume negative value Bo according to the positive adjustment curve.

13. A non-transitory computer readable storage medium, storing instructions executable by a processor to perform operations comprising:

utilizing a television to collect an ambient volume $V_R$;

utilizing the television to obtain a first current volume $V_C$ of the television;

calculating a difference between the first current volume $V_C$ of the television and the ambient volume $V_R$ according to a formula $\Delta V = V_R - V_C$;

determining whether an absolute value of the difference $|\Delta V|$ is greater than a threshold value $\delta$; and upon a condition that the absolute value of the difference $|\Delta V|$ is greater than the threshold value $\delta$, determining that the television volume needs to be adjusted; and upon a condition that the television volume needs to be adjusted, performing an intelligent volume adjustment on the television volume according to a sign of a difference between the first current volume $V_C$ of the television and the ambient volume $V_R$.

14. The non-transitory computer readable storage medium of claim 13, wherein the operation of performing the intelligent volume adjustment on the television volume according to the sign of the difference between the first current volume $V_C$ of the television and the ambient volume $V_R$ upon a condition that the television volume needs to be adjusted comprises:

calculating the sign of the difference $\Delta V = V_R - V_C$ between the first current volume $V_C$ of the television and the ambient volume $V_R$; and upon a condition that the sign of the difference $\Delta V$ is positive, loading a second current volume $V_T$ of a television and calculating a television volume positive value $V_O$ according to a formula $$V_O = V_T + \frac{lg(1+\Delta V)}{lg(1+\Delta V_{max})} \times (V_{max} - V_T),$$

where $V_{max}$ is a maximum adjustable volume value of the television, and $\Delta V_{max}$ is a difference between the ambient volume $V_R$ and the maximum adjustable volume value $V_{max}$.

15. The non-transitory computer readable storage medium of claim 14, wherein the operation of performing the intelligent volume adjustment on the television volume according to the sign of the difference between the first current volume $V_C$ of the television and the ambient volume $V_R$ upon a condition that the television volume needs to be adjusted comprises:

obtaining a positive adjustment curve according to a formula $$V_O = V_T + \frac{lg(1+\Delta V)}{lg(1+\Delta V_{max})} \times (V_{max} - V_T);$$

and
adjusting the television volume positive value Vo according to the positive adjustment curve.

16. The non-transitory computer readable storage medium of claim 13, wherein the operation of performing the intelligent volume adjustment on the television volume according to the sign of the difference between the first current volume $V_C$ of the television and the ambient volume $V_R$ upon a condition that the television volume needs to be adjusted comprises:

calculating the sign of the difference $\Delta V$ between the first current volume $V_C$ of the television and the ambient volume $V_R$; and upon a condition that the difference ΔV is a negative number, loading a second current volume $V_T$ of a television and calculating a television volume negative value Bo according to a formula $$B_O = \frac{\log_a(1 + \Delta V)}{\log_a(1 + \Delta V_{max})} \times V_T,$$

where a is equal to 0.1, $V_{max}$ is a maximum adjustable volume value of the television, and $\Delta V_{max}$ is a difference between the ambient volume $V_R$ and the maximum adjustable volume value $V_{max}$.

17. The non-transitory computer readable storage medium of claim 16, wherein the operation of performing the intelligent volume adjustment on the television volume according to the sign of the difference between the first current volume $V_C$ of the television and the ambient volume $V_R$ upon a condition that the television volume needs to be adjusted comprises:

obtaining a negative adjustment curve according to a formula $$B_O = \frac{\log_a(1 + \Delta V)}{\log_a(1 + \Delta V_{max})} \times V_T;$$

and adjusting the television volume negative value Bo according to the positive adjustment curve.

\* \* \* \* \*